United States Patent [19]

Satoh et al.

[11] Patent Number: 4,561,069

[45] Date of Patent: Dec. 24, 1985

[54] MAGNETIC BUBBLE MEMORY DEVICE GATES

[75] Inventors: Yoshio Satoh; Takeyasu Yanase, both of Yokohama; Kazunari Komenou, Kawasaki, all of Japan

[73] Assignee: Fujitsu Limited, Kawasaki, Japan

[21] Appl. No.: 505,978

[22] Filed: Jun. 20, 1983

[30] Foreign Application Priority Data

Jun. 23, 1982 [JP] Japan .............................. 57-106666
Mar. 4, 1983 [JP] Japan .............................. 58-034632

[51] Int. Cl.⁴ ............................................. G11C 19/08
[52] U.S. Cl. .................................... 365/36; 365/12; 365/16
[58] Field of Search .................. 365/15, 16, 36, 12

[56] References Cited

U.S. PATENT DOCUMENTS 4,360,904 11/1982 Gergis ................................. 365/36
4,415,988 11/1983 Komenou et al. ................... 365/16

OTHER PUBLICATIONS

IEEE Transactions on Magnetics–vol. Mag.–15, No. 6, Nov. 1979; pp. 1692–1696.

*Primary Examiner*—James W. Moffitt
*Attorney, Agent, or Firm*—Staas & Halsey

[57] ABSTRACT

A magnetic bubble memory device comprises minor loops for the storage of information and a major loop operably associated with the minor loops through gates, the minor loops being defined by an ion-implanted pattern and the gate portions of the major line being defined by patterns of magnetically soft material. This construction makes it possible to provide a high storage density and superior gate operating margins.

26 Claims, 33 Drawing Figures

MAGNETIC BUBBLE MEMORY DEVICE GATES

BACKGROUND OF THE INVENTION

This application is related to two U.S. applications having Ser. No. 513,610 Now U.S. Pat. No. 4,486,858 and Ser. No. 513,657, both filed July 14, 1983, which are assigned to the Assignee of the present application.

1. Field of the Invention

The present invention relates to a magnetic bubble memory device which is used as a memory device for an electronic computer or for a terminal device of the same. More particularly, the present invention relates to the construction of a gate which operably associates a major line with a minor loop in a major-minor looporganized magnetic bubble memory device.

2. Description of the Prior Art

There is a well-known magnetic bubble memory device which comprises a thin layer of magnetic material in which magnetic bubbles can propagate along propagation paths in response to a magnetic drive field rotating or reorienting cyclically in the plane of the magnetic layer. One of the most common arrangements of the propagation paths for magnetic bubble memory devices is a major-minor loop organization. This organization includes a plurality of minor loops for the storage of bubble information and one or two major lines, or loops, for the propagation of bubble information between a bubble generator and the minor loops, and between the minor loops and a bubble detector. The major line or lines and the minor loops are operably associated with each other through gates which perform various functions, such as the transfer, replication, or swapping of bubbles, whereby the writing and the reading of bubble information between the major line or lines and the minor loops are performed.

There are two well-known types of propagation paths, one being defined by elements or patterns of magnetically soft material such as permalloy and commonly referred to as a "permalloy propagation path" and the other being defined by an ion-implanted pattern and commonly referred to as an "ion-implanted propagation path". It is well known in the art that in the case of forming a propogation path having the same bit period, the minimum geometric size required for forming an ion-implanted propagation path is larger than that required for forming a permalloy propagation path, and, accordingly, an ion-implanted propagation path is a very promising means for providing a high-density storage magnetic bubble memory device in which the bit period is 4 $\mu$m or less and the memory capacity is 4 Mbit or more.

However, in a major-minor loop-organized magnetic bubble memory device employing an ion-implanted propagation path, it is very difficult to provide gates having superior operating margins, as is well known in the art.

SUMMARY OF THE INVENTION

It is, therefore, an object of the present invention to provide a major-minor loop-organized magnetic bubble memory device in which the storage density is high and the operating margins of the gates are superior.

According to the present invention, there is provided a magnetic bubble memory device including a magnetic layer in which magnetic bubbles can be moved, at least one major line and a plurality of minor loops for the storage of information. Bubbles are propagated along the minor loops in the magnetic layer in response to a magnetic drive field rotating in the plane of the magnetic layer. The major line or lines have gate portions defined by patterns of magnetically soft material formed on the magnetic and the minor loops are defined by an ion-implanted pattern in the magnetic layer and have gate portions provided with cups. Also included are a pluraltiy of gates adapted to operably associate the major line or lines with the minor loops and include conductor patterns extending between the gate portions of the major line or lines and the gate portions of the minor loops.

In a preferred embodiment, each of the gate portions of the major line or lines has a pickax pattern, and each of the conductor patterns is formed with a U-shaped configuration. In another embodiment, each of the conductor patterns is formed so that it has a meandering configuration having two U-shaped patterns extending in opposite directions.

The embodiments of the present invention are now described with reference to the accompanying drawings.

DESCRIPTION OF THE PREFERRED EMBODIMENTS

Figure 1:
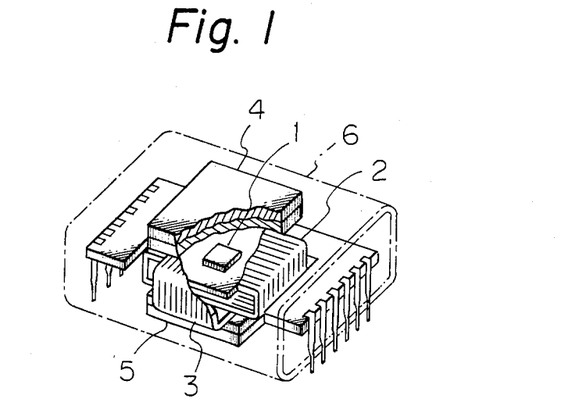
FIG. 1 is a partially broken perspective view of a magnetic bubble memory device according to the present invention in which the general construction thereof is illustrated.

In FIG. 1, a magnetic bubble memory device includes a magnetic bubble memory chip 1 and two coils 2 and 3 disposed perpendicular to each other and adapted to generate a magnetic field rotating or reorienting cyclically in the plane of the chip 1 so as to drive magnetic bubbles in the chip 1. Permanent magnets 4 and 5 are adapted to generate a bias magnetic field so as to stably maintain the magnetic bubbles and a shield case 6 (indicated by the phantom line) surrounds the device.

Figure 2:
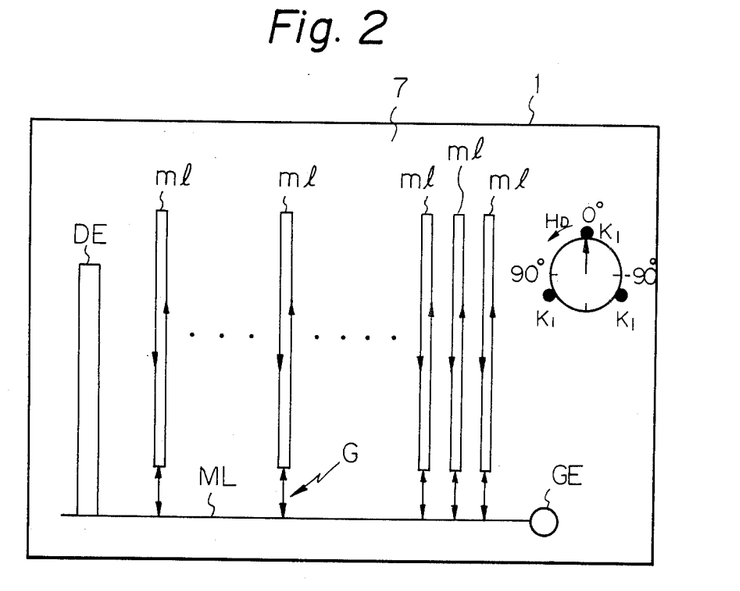
FIG. 2 illustrates an embodiment of a magnetic bubble memory chip according to the present invention.

In FIG. 2, the memory chip 1 includes a substrate of gadolinium-gallium-garnet (not illustrated) on which a thin layer of magnetic material 7, a bubble generator GE, a bubble detector DE, a major line ML, a plurality of minor loops ml, and replicate/swap gates G are formed. The symbol $K_1$ designates the easy axes of stripe-out in the magnetic layer 7. The magnetic bubbles can be propagated in the magnetic layer 7 along the major line ML and the minor loops ml in response to rotation or reorientation of the in-plane drive field $H_D$. The minor loops ml comprise a storage section for storing bubble information. The major line ML comprises a path for the propagation of bubble information between the generator GE and the minor loops ml and between the minor loops ml and the detector DE. The major line ML is operably associated with the minor loops ml through the replicate/swap gates G, and thereby the writing of bubble information from the major line ML into the minor loops ml and reading of bubble information from the minor loops ml onto the major line ML are performed.

Figure 3:
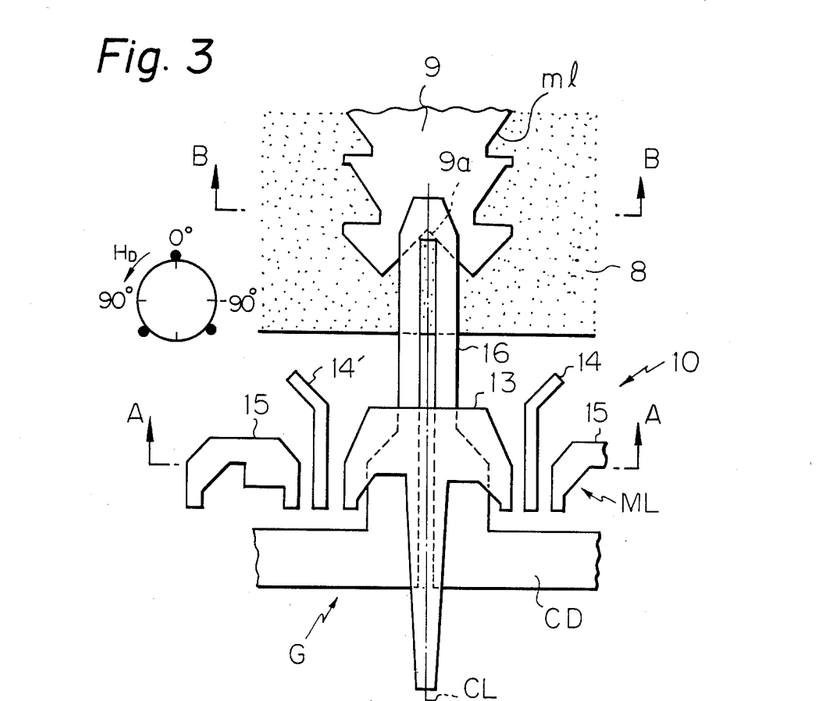
FIG. 3 illustrates a replicate/swap gate in the memory chip illustrated in FIG. 2.
Figure 4:
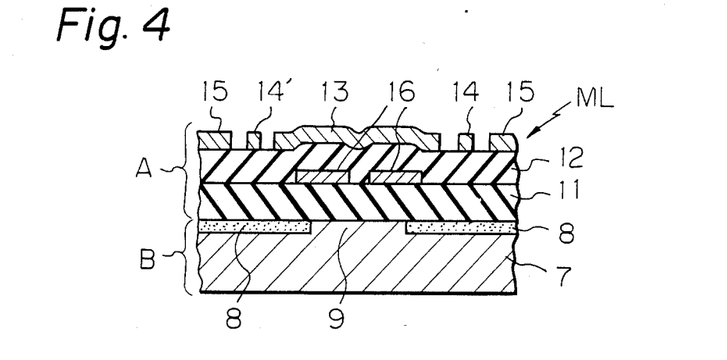
FIG. 4 is a sectional view of the memory chip of FIG. 2, the part A being taken along the line A—A in FIG. 3 and the part B being taken along the line B—B in FIG. 3.

In FIGS. 3 and 4, the magnetic layer 7 is provided with an ion-implanted pattern, which is formed therein by a well-known ion-implantation technique and which includes an ion-implanted region 8 and a plurality of non-implanted regions 9 surrounded by the ion-implanted region 8. The minor loops ml are defined by the respective peripheries of the non-implanted regions 9. Each of the minor loops ml extends parallel to one of the easy axes $K_1$ of stripeout in the magnetic layer 7 and is provided in the gate portion (the lower portion of the minor loop) with a cusp 9a associated with the gate G.

On the magnetic layer 7, two layers of spacers 11 and 12 of insulating material are formed. In the region of the spacer 12, which corresponds to a non-implanted region 10 in the magnetic layer 7, there are formed a plurality of permalloy patterns or elements, including pickax patterns 13, bar patterns 14 and 14', and halfdisk patterns 15, which define the major line ML. The permalloy patterns 13 are disposed adjacent to the gate portions of the minor loops ml and comprise the gate portions of the major line ML associated with the gates G. Each of the pickax patterns 13 has a center line CL which is parallel to the easy axis $K_1$ of stripeout to which the minor loops ml extend in parallel, and which is aligned with the cusp 9a in the gate portion of the minor loop ml.

A conductor CD is formed between the spacers 11 and 12 and has a plurality of U-shaped patterns or hairpin loops 16. Each of the hairpin loops 16 extends along the center line CL of the pickax pattern 13 between the head portion of the pickax pattern 13 and the gate portion cusp 9a of the minor loop ml, and thereby the replicate gate G is constructed.

Figure 5A:
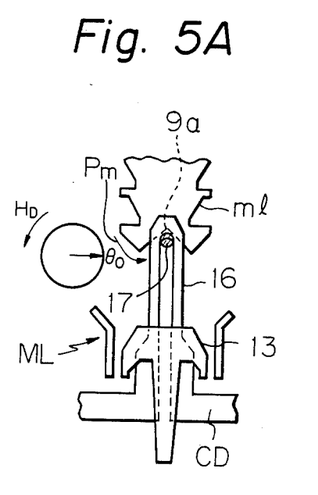
FIGS. 5A through 5H illustrate a replicate operation of the gate illustrated in FIG. 3.
Figure 5B:
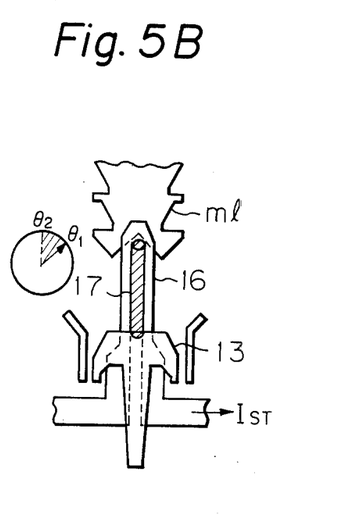
Figure 5C:
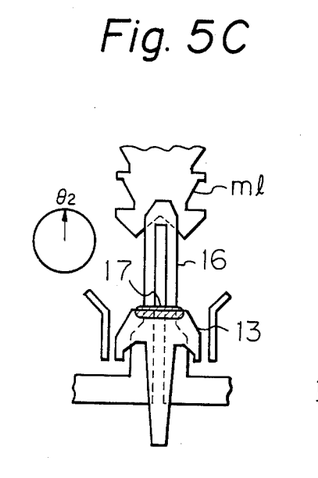
Figure 5D:
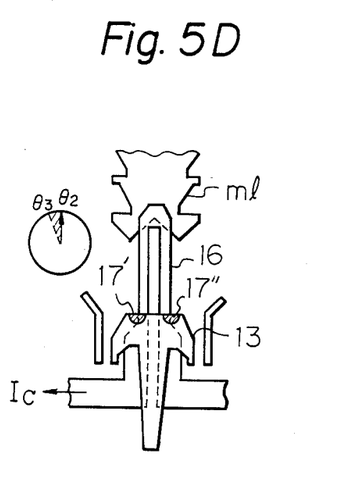
Figure 5E:
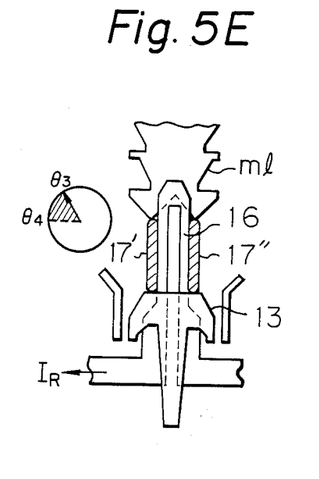
Figure 5F:
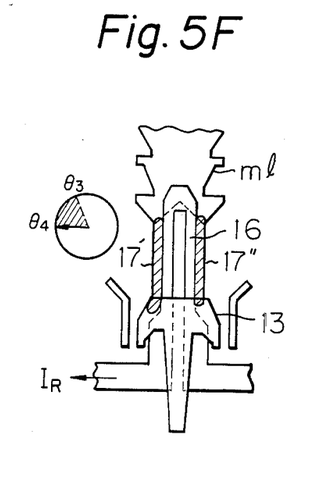
Figure 5G:
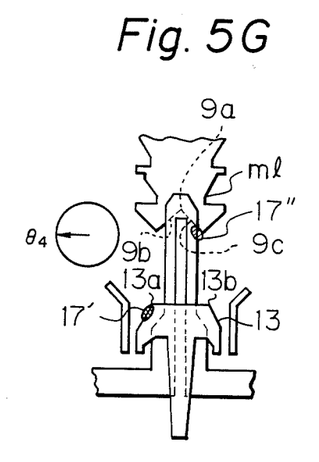
Figure 5H:
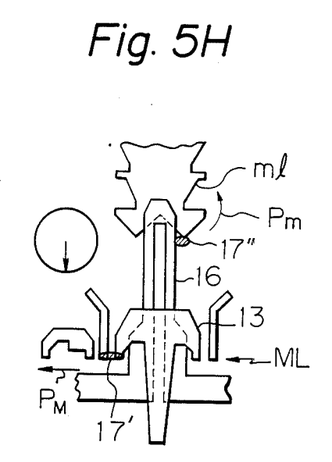
Figure 6:
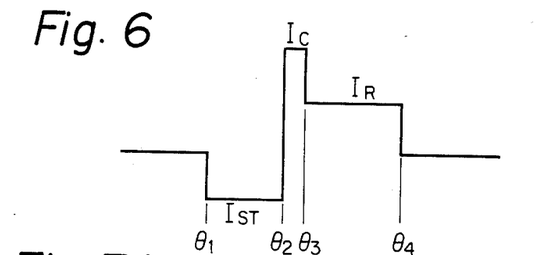
FIG. 6 is a waveform diagram of a replicate current.

The replicate operation of the gate G is now described with reference to FIGS. 5A through 5H and FIG. 6. Referring first to FIG. 5A, when the drive field $H_D$ is at phase $\theta_0$, a bubble 17 propagating along the minor loop ml in the direction of the arrow Pm is trapped in the gate portion cusp 9a. Referring to FIG. 5B, a bubble-stretch pulse of current $I_{ST}$ is applied to the conductor CD from phase $\theta_1$ to phase $\theta_2$ of the drive field $H_D$ so that the bubble 17 is stretched along the inner edges of the conductor hairpin loop 16 between the cusp 9a of the minor loop ml and the head portion of the pickax pattern 13 of the major line ML. Referring to FIG. 5C, the stretch current $I_{ST}$ is turned off at phase $\theta_2$ of the drive field $H_D$ so that the stretched bubble 17 is shrunk, is attracted to the head portion of the pickax pattern 13, and is stretched along the top edge of the pickax pattern 13 across the hairpin loop 16. Then, referring to FIG. 5D, at phase $\theta_2$, in which the stretch current $I_{ST}$ is turned off, a bubble-cut pulse of current $I_C$ having a polarity opposite to that of the stretch current $I_{ST}$ is applied to the conductor CD so that the bubble 17 is divided into two bubbles 17' and 17''. The cut current $I_C$ is applied until the drive field $H_D$ rotates to phase $\theta_3$. Referring to FIGS. 5E and 5F, a bubble-return pulse of current $I_R$, having the same polarity as but a magnitude smaller than the cut current $I_C$, is applied to the conductor CD from phase $\theta_3$ to phase $\theta_4$ of the drive field $H_D$. During this period of time, the two bubbles 17' and 17'' are stretched along the respective outer edges of the hairpin loop 16 between the pickax pattern 13 and the minor loop ml and remain stretched. Referring to FIG. 5G, the return current $I_R$ is turned off at phase $\theta_4$. At this phase, the left side 9b and the right side 9c of the cusp 9a become magnetically repulsive and attractive, respectively, to the bubbles while the left shoulder 13a and the right shoulder 13b of the head portion of the pickax pattern 13 become magnetically attractive and repulsive, respectively, to the bubbles. Accordingly, the bubbles 17' and 17'' are attracted to the pickax pattern 13 and the minor loop ml, respectively. As the drive field $H_D$ further rotates, as illustrated in FIG. 5H, the bubble 17' on the major line ML propagates in the direction of the arrow $P_M$ while the bubble 17'' on the minor loop ml propagates in the direction of the arrow $P_m$, whereby the replicate operation is completed. Thereby, the non-destructive reading of bubble information stored in the minor loops ml into the major line ML is performed.

Figure 7A:
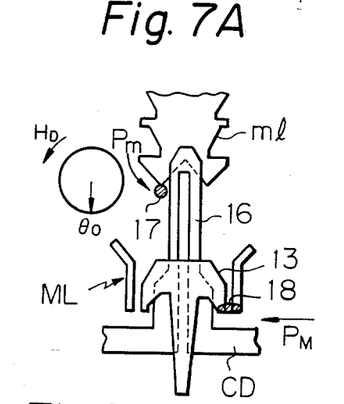
FIGS. 7A through 7D illustrate a swap operation of the gate illustrated in FIG. 3.
Figure 7B:
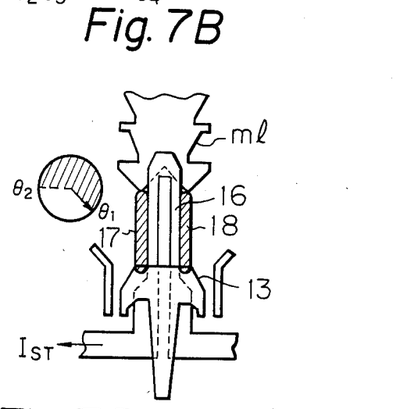
Figure 7C:
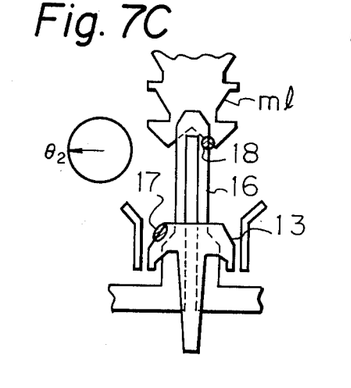
Figure 7D:
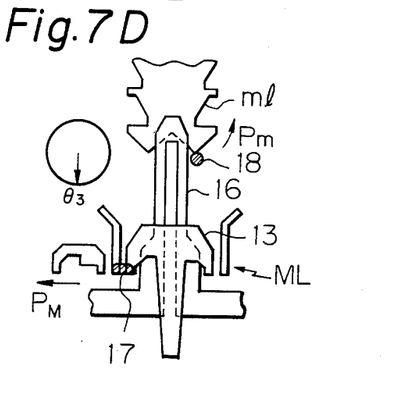
Figure 8:
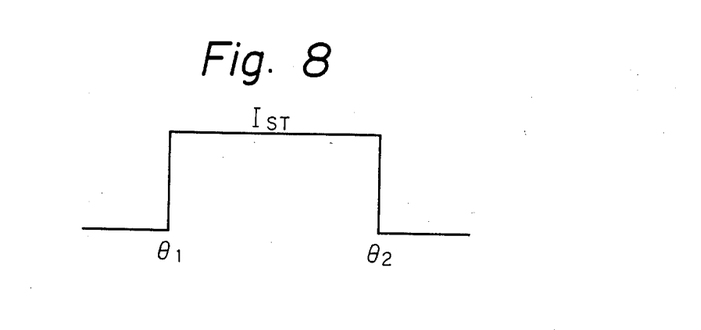
FIG. 8 is a waveform diagram of a swap current.

Next, the swap operation of the gate G is described with reference to FIGS. 7A through 7D and FIG. 8. Referring first to FIG. 7A, when the drive field $H_D$ is at phase $\theta_0$, a bubble 17 on the minor loop ml and a bubble 18 on the major line ML propagate to the illustrated positions in the direction of the arrows $P_m$ and $P_M$, respectively. Referring to FIG. 7B, a bubblestretch current $I_{ST}$ is applied to the conductor CD from phase $\theta_1$ to phase $\theta_2$ of the drive field $H_D$ so that the bubbles 17 and 18 are stretched along the outer edges of the conductor hairpin loop 16 between the gate portion of the minor loop ml and the head portion of the pickax pattern 13 and remain stretched. Referring to FIG. 7C, the stretch current $I_{ST}$ is turned off at phase $\theta_2$ of the drive field $H_D$ so that the bubbles 17 and 18 are shrunk and are attracted to the pickax pattern 13 and the minor loop ml, respectively, in the manner previously described with reference to FIG. 5G. As the drive field $H_D$ further rotates, as illustrated in FIG. 7D, the bubble 17 on the major line ML propagates in the direction of the arrow $P_M$ while the bubble 18 on the minor loop ml propagates in the direction of the arrow $P_m$, and thereby the swap operation is completed. Therefore, the new bubble information on the major line ML is substituted for the old bubble information stored in the minor loops ml, i.e., the rewriting of information has been performed. Moreover, it will be understood that the abovedescribed replicate/swap gates G can act as transfer-in gates for the transfer of bubble information from the major line ML to the minor loops ml or as transfer-out gates for the transfer of bubble information from the minor loops ml to the major line ML in the same manner as the abovedescribed swap operation.

As was described above, according to the present invention, the minor loops ml for the storage of the bubble information are defined by an ion-implanted pattern. Accordingly, it is possible to provide high-density storage as previously described. Moreover, the gate portions of the major line ML are defined by permalloy patterns, and, accordingly, it is possible to provide gates superior in operating margins. It should be noted that the major line ML in the above-described embodiment is defined entirely by permalloy patterns. However, in order to realize the object of the present invention, only the gate portions of the major line ML need be defined by permalloy patterns, and the other portions of the major line ML may be defined by ion-implanted patterns.

Figure 9:
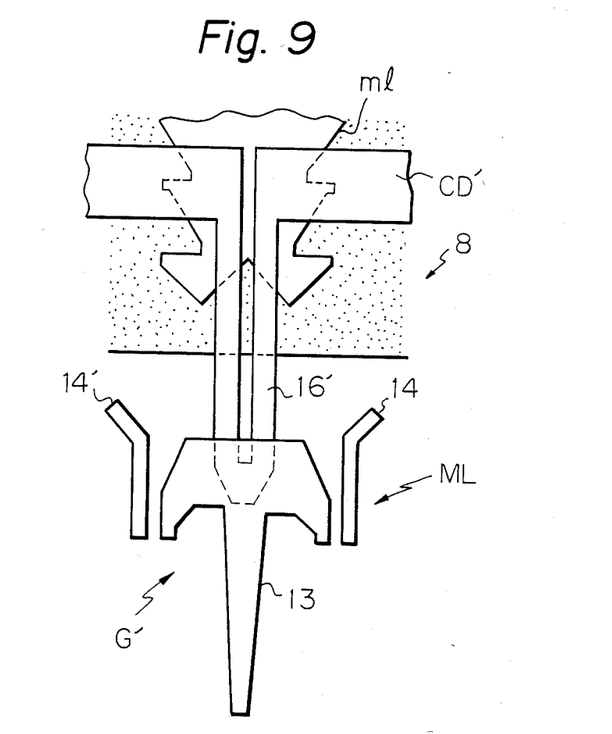
FIG. 9 illustrates a modification of the replicate/swap gate illustrated in FIG. 3.

Referring to FIG. 9, a gate G' is a modification of the gate G illustrated in FIG. 3, in which the same parts are designated by the same reference numerals and symbols as in FIG. 3. The gate G' has basically the same design, operation, and function as the gate G, there being only one difference in that a conductor CD' is turned by 180° as compared to the conductor CD.

Figure 10:
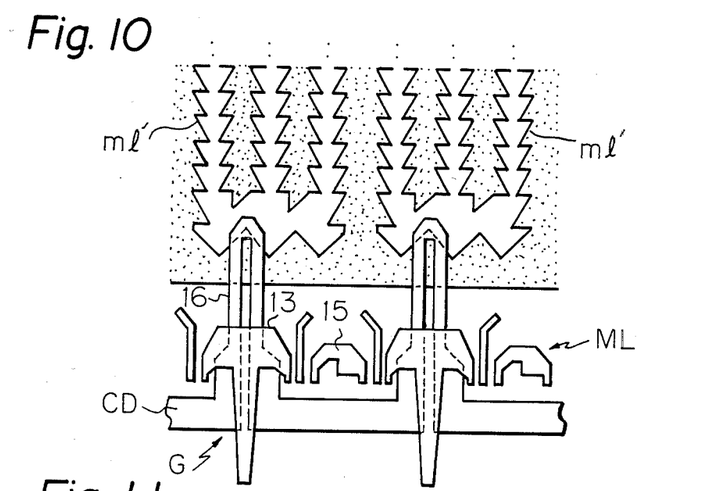
FIG. 10 is an enlarged view of part of a modification of the memory chip illustrated in FIG. 2.

In FIG. 10, is an enlarged illustration of a modification of the memory chip illustrated in FIG. 2. In this modification, the major line ML and the gates G are the same as those illustrated in FIG. 3, but the minor loops ml' are different from those illustrated in FIG. 3. Each minor loop ml' has a W-shaped configuration which is formed by interconnecting three sub-minor loops, such as the minor loops ml illustrated in FIGS. 2 and 3, at the ends thereof adjacent to the major line ML. This configuration is advantageous in that the gates G can be arranged at longer intervals.

Figure 11:
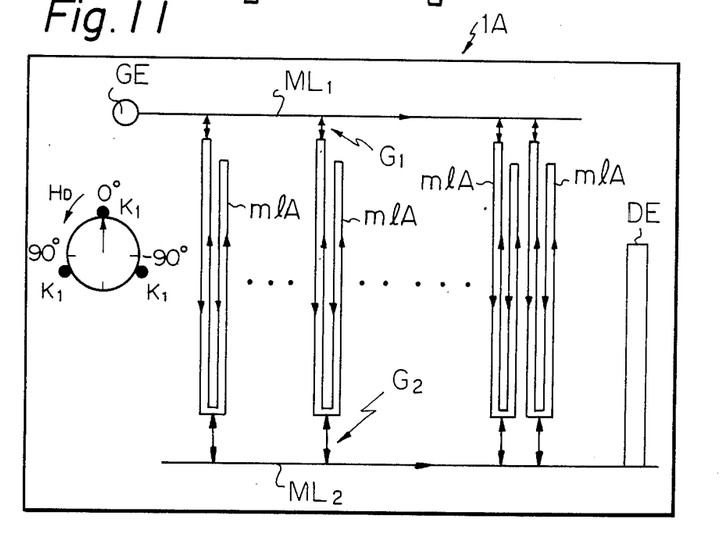
FIG. 11 illustrates the constitution of another embodiment of a magnetic bubble memory chip according to the present invention.

In FIG. 11, there is illustrated another embodiment of a memory chip according to the present invention. A memory chip 1A is provided with a bubble generator GE, a bubble detector DE, two major lines $ML_1$ and $ML_2$, a plurality of minor loops mlA, a swap gate $G_1$, and a replicate gate $G_2$. The first major line $ML_1$ is adapted for the propagation of bubble information from the generator GE to the minor loops mlA, and the swap gate $G_1$ functions to write bubble information from the major line $ML_1$ into the minor loops mlA. The second major line $ML_2$ is adapted for the propagation of bubble information from the minor loops mlA to the detector DE, and the replicate gate $G_2$ functions to read bubble information out of the minor loops mlA into the major line $ML_2$.

Figure 12:
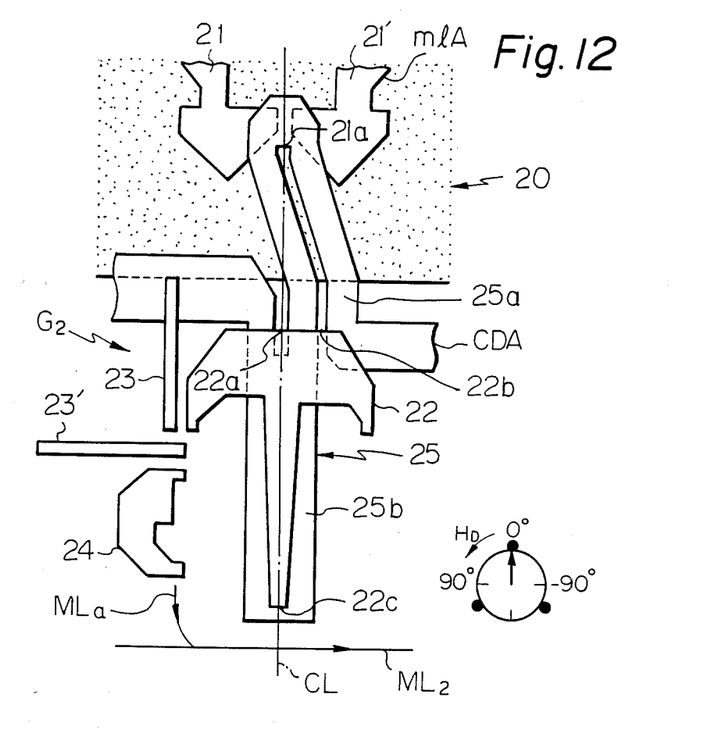
FIG. 12 illustrates a replicate gate in the memory chip illustrated in FIG. 11.

The memory chip 1A has basically the same layered construction as that described with reference to FIG. 4. In FIG. 12, each of the minor loops mlA is defined in the magnetic layer by the outer edges of a pair of non-implanted regions 21 and 21' which are opposed to each other with a small gap therebetween and which are surrounded by an ion-implanted region 20. Each of the minor loops mlA and has a U-shaped configuration and is provided with a cusp 21a in the gate portion associated with the gate $G_2$. In FIG. 11, the construction of the major line $ML_1$ and the swap gate $G_1$ for writing bubble information is the same as that illustrated in FIG. 3 or FIG. 9 except that it is turned by 180°. The operation of the swap gate $G_1$ is the same as that previously described with reference to FIGS. 7A through 7D and FIG. 8.

The major line, for reading bubble information, is defined, like the major lines ML and $ML_1$, by permalloy patterns. However, the major line $ML_2$ has auxiliary paths MLa. Referring to FIG. 12, each of the auxiliary paths MLa is defined by a plurality of permalloy patterns, including a pickax pattern 22, bar patterns 23 and 23', and half-disk patterns 24. The pickax patterns 22 of the auxiliary paths MLa are disposed adjacent to the gate portion cusps 21a of the minor loops mlA and comprise the gate portions of the major line $ML_2$. Each of the pickax patterns 22 has a center line CL which is parallel to one of the easy axes $K_1$ of stripe-out in the magnetic layer and is aligned with the cusp 21a.

A conductor CDA is formed between the minor loops mlA and the major line $ML_2$ and has a plurality of meandering patterns 25. Each of the meandering patterns 25 has two U-shaped patterns or hairpin loops 25a and 25b which extend in opposite directions. The first hairpin loop 25a extends between the right shoulder 22b of the head portion of the pickax pattern 22 and the gate portion cusp 21a of the minor loop mlA, and the second hairpin loop 25b extends between the middle 22a of the head portion and the tail end 22c of the pickax pattern 22, thereby forming the replicate gate $G_2$.

Figures 13A, 13B:
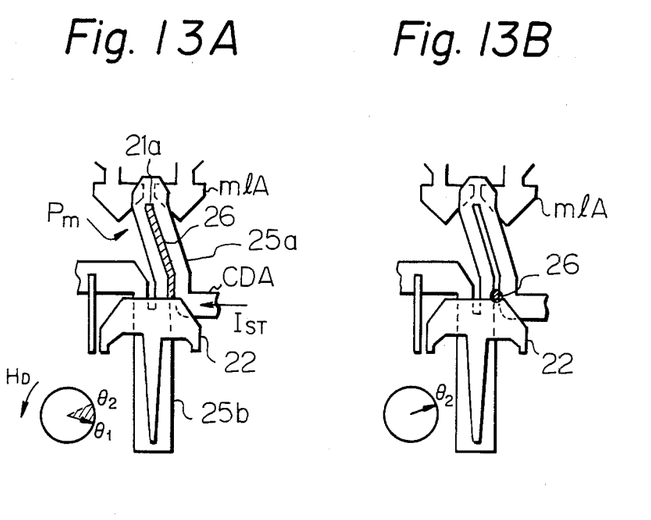
FIGS. 13A through 13G illustrate a replicate operation of the gate illustrated in FIG. 12.
Figures 13C, 13D:
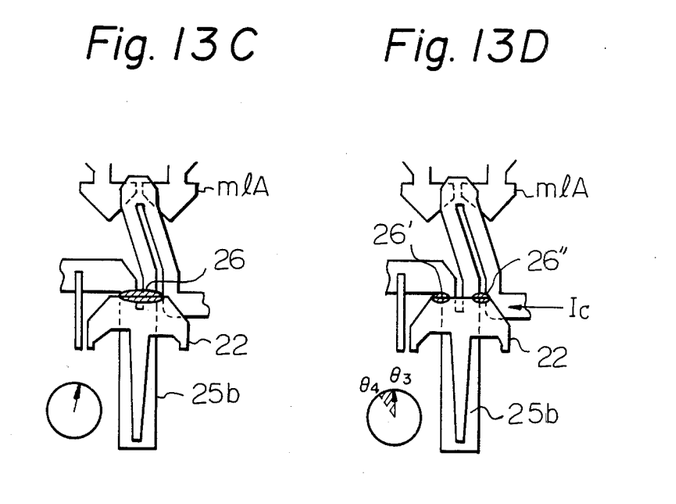
Figure 13E:
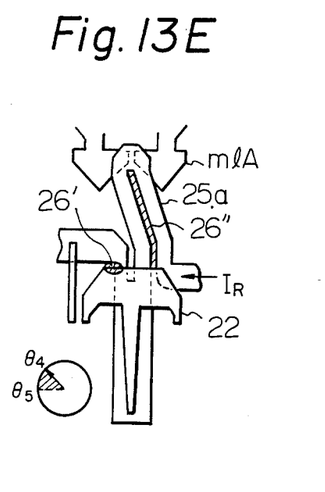
Figure 13F:
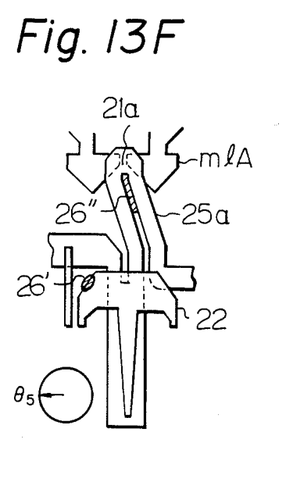
Figure 13G:
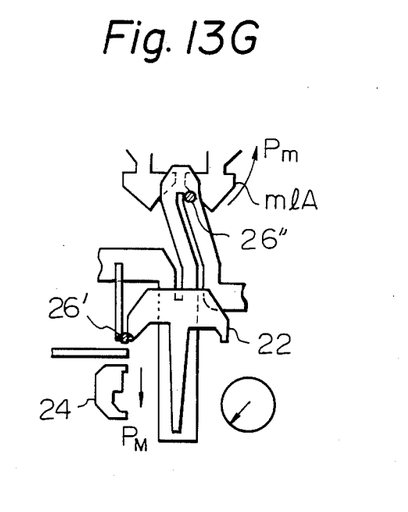
Figure 14:
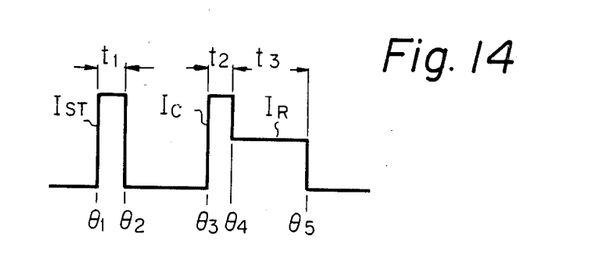
FIG. 14 is a waveform diagram of a replicate current.

The replicate operation of the gate $G_2$ will now be described with reference to FIGS. 13A through 13G and FIG. 14. Referring first to FIG. 13A, when the drive field $H_D$ is at phase $\theta_1$, a bubble 26 propagating along the minor loop mlA in the direction of the arrow $P_m$ is trapped in the gate portion cusp 21a. From phase $\theta_1$ to phase $\theta_2$ of the drive field $H_D$, a bubble-stretch current $I_{ST}$ is applied to the conductor CDA so that the bubble 26 is stretched along the inner edges of the first hairpin loop 25a between the cusp 21a of the minor loop mlA and the right shoulder 22b of the pickax pattern 22. Referring to FIG. 13B, the stretch current $I_{ST}$ is turned off at phase $\theta_2$ so that the stretched bubble 26 is shrunk, is attracted to the pickax pattern 22. In FIG. 13C, the bubble 26 is stretched along the top edge of the pickax pattern 22 across the second hairpin loop 25b. Then, referring to FIG. 13D, a bubble-cut current $I_C$, which has the same polarity as the stretch current $I_{ST}$, is applied to the conductor CDA from phase $\theta_3$ to phase $\theta_4$ of the drive field $H_D$, with the result that the bubble 26 is divided into two bubbles 26' and 26''. Referring to FIG. 13E, a bubble-return current $I_R$, which has the same polarity as but a smaller magnitude than the cut current $I_C$, is applied to the conductor CDA from phase $\theta_4$ to phase $\theta_5$ of the drive field $H_D$, with the result that the bubble 26' remains trapped on the pickax pattern 22 but the bubble 26'' is again stretched along the inner edges of the first hairpin loop 25a between the pickax pattern 22 and the gate portion cusp 21a of the minor loop mlA. Referring to FIG. 13F, the return current $I_R$ is turned off at phase $\theta_5$ of the drive field $H_D$. At this phase, the right shoulder 22b of the pickax pattern 22 and the cusp 21a of the minor loop mlA become magnetically repulsive and attractive, respectively, to the bubbles, and, accordingly, the bubble 26'' is shrunk and is attracted to the minor loop mlA. As the drive field $H_D$ further rotates, as illustrated in FIG. 13G, the bubble 26' on the pickax pattern 22 propagates in the direction of the arrow $P_M$ while the bubble 26'' on the minor loop mlA propagates in the direction of the arrow $P_m$, and thereby the replicate operation is completed.

It is easily understood that the above-described replicate gates $G_2$ can act as transfer-out gates for the transfer of bubble information from the minor loops to the major line, if the stretch current $I_{ST}$ only is applied and the cut current $I_C$ and the return current $I_R$ are not applied, to the conductor CDA.

Figure 15A:
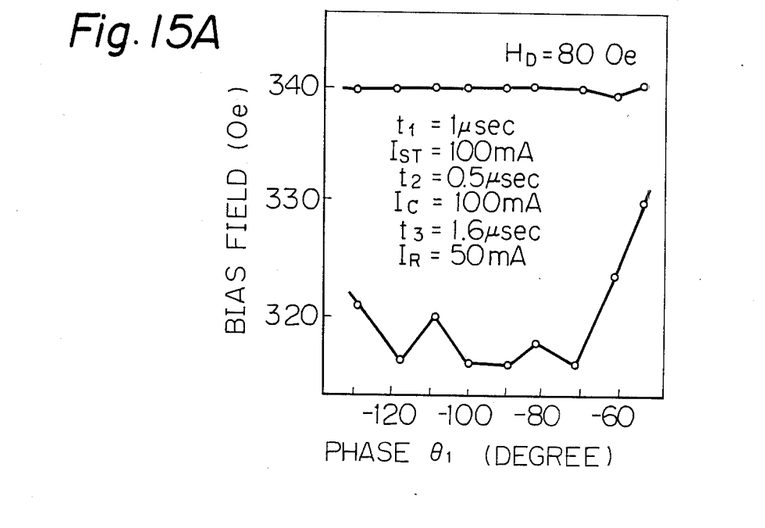
FIGS. 15A and 15B are diagrams illustrating the operating characteristics of the replicate gate illustrated in FIG. 12.
Figure 15B:
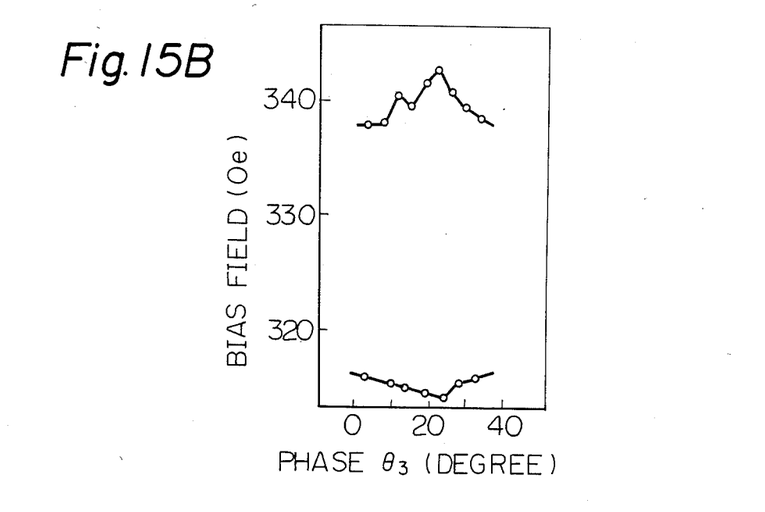

FIGS. 15A and 15B illustrate the operating characteristics in the replicate gate $G_2$. FIG. 15A illustrates phase margins in relation to phase $\theta_1$, at which the pulse of the stretch current $I_{ST}$ rises. FIG. 15B illustrates phase margins in relation to phase $\theta_3$, at which the pulse of the cut current $I_C$ rises FIGS. 15A and 15B are based upon the assumptions that the bubble diameter is 1 $\mu$m, the drive field $H_D$ is 80 Oe, the stretch current $I_{ST}$ is 100 mA, the cut current $I_C$ is 100 mA, the return current $I_R$ is 50 mA, and the current pulse durations $t_1$, $t_2$, and $t_3$ (FIG. 14) are 1 $\mu$sec, 0.5 $\mu$sec, and 1.6 $\mu$sec, respectively.

The replicate gate $G_2$ described above has an advantage over the gate G illustrated in FIG. 3. That is, in the gate G, it is necessary that the stretch current $I_{ST}$ have a polarity opposite to those of the cut current $I_C$ and the return current $I_R$ in the replicate operation thereof, as was previously described with reference to FIGS. 5A through 5H and FIG. 6, and, accordingly, the gate driving circuit is complicated. In the gate $G_2$, on the other hand, the stretch current $I_{ST}$, the cut current $I_C$, and the return current $I_R$ all have the same polarity, and therefore the gate driving circuit can be simplified.

However, the gate $G_2$ has a disadvantage in that, as will be understood from FIGS. 13C and 13D, the interval between the phase at which the bubble 26 starts to stretch and the phase which is appropriate for cutting the bubble is small. Namely, the time margin for bubble stretching is small.

Figure 16:
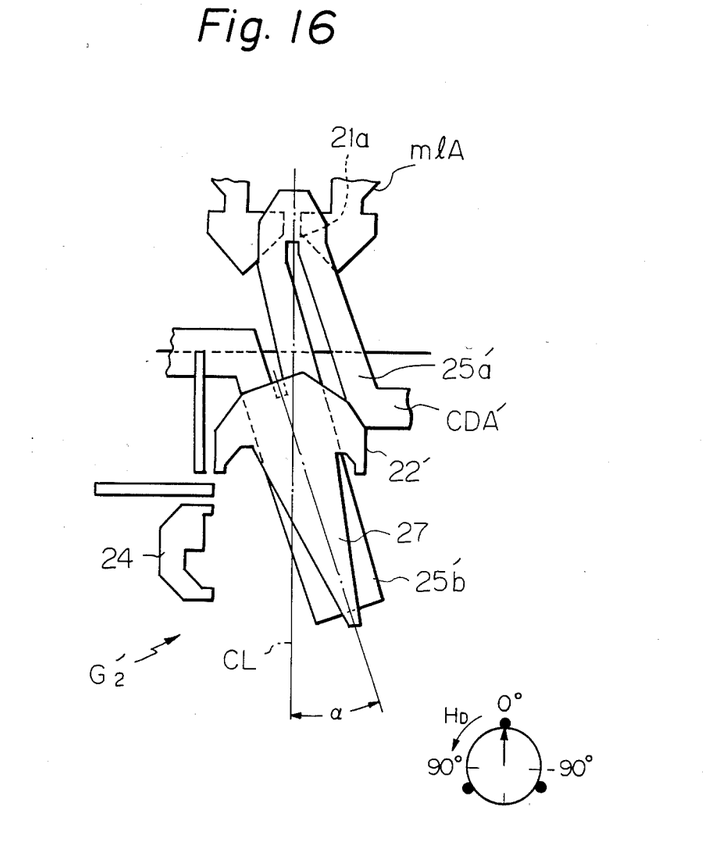
FIG. 16 illustrated a modification of the replicate gate illustrated in FIG. 12.

FIG. 16 illustrates an improved gate $G_2'$ the aim of which is to eliminate the above-described disadvantage. The gate $G_2'$ is basically the same in construction as the gate $G_2$. The gate $G_2'$ differs in that the tail portion 27 of the pickax pattern 22' and the second hairpin loop 25b' of the meandering pattern of the conductor CDA' are inclined at an angle $\alpha$ with respect to the center line CL of the head portion of the pickax pattern 22' in the direction of rotation of the drive field $H_D$. According to this arrangement, a phase appropriate for cutting the bubble stretched on the pickax pattern 22' of gate $G_2'$ is later than that for gate $G_2$, and, accordingly, the time margin for bubble stretching on the pickax pattern 22' is greatly increased.

As was described above, according to the present invention, it is possible to provide a magnetic bubble memory device in which the storage density is high and gates associating with the major line and the minor loops have large operating margins.

We claim:

1. A magnetic bubble memory device generating a magnetic drive field, comprising:
    a magnetic layer in which magnetic bubbles can be propagated;
    a major line, formed entirely by patterns of magnetically soft material on said magnetic layer, along which the magnetic bubbles propagate in response to the magnetic drive field rotating in the plane of said magnetic layer, said major line having gate portions defined by patterns of magnetically soft material formed on said magnetic layer;
    minor loops, defined by an ion-implanted pattern in said magnetic layer, having gate portions, each of the gate portions of said minor loops having a cusp and corresponding to one of the gate portions of said major line; and
    gates, operatively associating said major line with said minor loops, comprising conductor patterns extending between the gate portions of said major line and the corresponding gate portions of said minor loops.

2. A magnetic bubble memory device according to claim 1, wherein said major line comprises a single major line and said gates comprise replicate/swap gates.

3. A magnetic bubble memory device according to claim 1,
    wherein said major line comprises:
        a first major line for writing information; and
        a second major line for reading information, and
    wherein said gates comprise:
        swap gates disposed between said first major line and said minor loops; and
        replicate gates disposed between said second major line and said minor loops.

4. A magnetic bubble memory device according to claim 1, wherein each of said minor loops comprises sub-minor loops, each of the sub-minor loops having a common end where the gate portion is located.

5. A magnetic bubble memory device according to claim 1, wherein each of the gate portions of said major line comprises a pickax permalloy pattern.

6. A magnetic bubble memory device according to claim 5,
    wherein said magnetic layer has easy axes of stripe-out, and
    wherein the pickax permalloy pattern of each of the gate portions of said major line has a head portion disposed adjacent to the cusp in the corresponding gate portion of said minor loops and a center line parallel to one of the easy axes of stripe-out in said magnetic layer.

7. A magnetic bubble memory device according to claim 6, wherein the center line of the pickax permalloy pattern of each of the major line gate portions is aligned with the cusp of the corresponding gate portion of said minor loops.

8. A magnetic bubble memory device according to claim 6, wherein each of the conductor patterns comprises a U-shaped pattern extending between the head portion of the pickax permalloy pattern of each of the gate portions of said major line and the cusp in the corresponding gate portion of said minor loops.

9. A magnetic bubble memory device according to claim 8, wherein said gates are operatively connected to receive a replicate current and a swap current for replicating the bubbles from said minor loops to said major line and for swapping the bubbles between said major line and said minor loops, respectively.

10. A magnetic bubble memory device according to claim 9, wherein the replicate current comprises a bubble-stretch pulse having a first polarity, a bubble-cut pulse following the bubble-stretch pulse and having a magnitude and a second polarity opposite to the first polarity, and a return pulse following the bubble-cut pulse, the return pulse having the second polarity and a magnitude smaller than the magnitude of the bubble-cut pulse.

11. A magnetic bubble memory device according to claim 9, wherein the swap current comprises a bubble-stretch pulse.

12. A magnetic bubble memory device according to claim 6, wherein the pickax permalloy pattern has a tail portion, and wherein each of the conductor patterns comprises:
a first U-shaped pattern extending between the head portion of the pickax permalloy pattern of each of the gate portions of said major line and the cusp of the corresponding gate portion of said minor loops; and
a second U-shaped pattern extending in a direction opposite to that of said first U-shaped pattern between the head portion and the tail portion of the pickax permalloy pattern.

13. a magnetic bubble memory device according to claim 12, wherein said gates are operatively connected to receive a replicate current for replicating the bubbles from said minor loops onto said major line.

14. A magnetic bubble memory device according to claim 13, wherein the replicate current comprises a bubble-stretch pulse having a polarity, a bubble-cut pulse following the bubble-stretch pulse, having a magnitude and the same polarity as the bubble-stretch pulse, and a return pulse following the bubble-cut pulse, the return pulse having the same polarity as and a smaller magnitude than the bubble-cut pulse.

15. A magnetic bubble memory device according to claim 12, wherein said gates are operatively connected to receive a bubble-stretch current for transferring the magnetic bubbles from said minor loops to said major line.

16. A magnetic bubble memory device according to claim 12, wherein the tail portion of the pickax permalloy pattern and the second Ushaped pattern of each of the conductor patterns are inclined with respect to the center line of the pickax permalloy pattern in the direction of rotation of the drive field.

17. A magnetic bubble memory device according to claim 12, wherein said first U-shaped pattern has a base and two parallel arms, both of the arms of said first U-shaped pattern having an S-shape whereby the base of said first U-shaped pattern is aligned with the center line of the pickax permalloy pattern.

18. A magnetic bubble memory device generating a magnetic drive field, comprising:
a magnetic layer, having easy axes of stripe-out, in which magnetic bubbles can be propagated;
a major line in said magnetic layer, along which the magnetic bubbles propagate in response to the magnetic drive field rotating in the plane of said magnetic layer, said major line having gate portions comprising a pickax permalloy pattern, formed on said magnetic layer, having a center line parallel to one of the easy axes of stripe-out in said magnetic layer and having a head portion;
minor loops, defined by an ion implanted pattern in said magnetic layer, having gate portions, each of the gate portions of said minor loops corresponding to one of the gate portions of said major line and having a cusp disposed adjacent to the head portion of the pickax permalloy pattern in the corresponding gate portion of said major line; and
gates, operatively associating said major line with said minor loops and operatively connected to receive a replicate current and a swap current, each of said gates comprising Ushaped conductor patterns extending between the cusp in the gate portion of each of said minor loops and the head portion of the pickax permalloy pattern of the corresponding gate portion of said major line, said gates replicating the magnetic bubbles from said minor loops to said major line and swapping the magnetic bubbles between said major line and said minor loops in response to the replicate current and the swap current, respectively.

19. A magnetic bubble memory device according to claim 18, wherein the replicate current comprises a bubble-stretch pulse having a first polarity, a bubble-cut pulse following the bubblestretch pulse and having a magnitude and a second polarity opposite to the first polarity, and a return pulse following the bubble-cut pulse, the return pulse having the second polarity and a magnitude smaller than the magnitude of the bubble-cut pulse.

20. A magnetic bubble memory device according to claim 18, wherein the swap current comprises a bubble-stretch pulse.

21. A magnetic bubble memory device generating a magnetic drive field, comprising:
a magnetic layer, having easy axes of stripe-out, in which magnetic bubbles can be propagated;
a major line in said magnetic layer, along which the magnetic bubbles propagate in response to the magnetic drive field rotating in the plane of said magnetic layer, said major line having gate portions, each of the gate portions comprising a pickax permalloy pattern, formed on said magnetic layer, having a head portion and a tail portion with a center line parallel to one of the easy axes of stripe-out in said magnetic layer;
minor loops, defined by an ion-implanted pattern in said magnetic layer, having gate portions, each of the gate portions of said minor loops corresponding to one of the gate portions of said major line and having a cusp disposed adjacent to the head portion of the pickax permalloy pattern of the corresponding gate portion of said major line; and
gates, operatively associating said major line with said minor loops, comprising conductor patterns, each of the conductor patterns comprising:
a first U-shaped pattern extending between the cusp of each of the gate portions of said minor loops and the head portion of the pickax permalloy pattern of the corresponding gate portion of said major line; and
a second U-shaped pattern extending in a direction opposite to that of said first U-shaped pattern between the head portion and the tail portion of the pickax permalloy pattern of the corresponding gate portion of said major line.

22. A magnetic bubble memory device according to claim 21, wherein said gates are operatively connected to receive a replicate current for replicating the bubbles from said minor loops onto said major line.

23. A magnetic bubble memory device according to claim 22, wherein the replicate current comprises a bubble-stretch pulse having a polarity, a bubble-cut pulse following the bubblestretch pulse, having a magnitude and the same polarity as the bubble-stretch pulse, and a return pulse following the bubble-cut pulse, the return pulse having the same polarity as and a smaller magnitude than the bubble-cut pulse.

24. A magnetic bubble memory device according to claim 21, wherein said gates are operatively connected to recieve a bubblestretch current for transferring the magnetic bubbles from said minor loops.

25. A magnetic bubble memory device according to claim 21, wherein the tail portion of the pickax permalloy pattern and the second U-shaped pattern of each of the conductor patterns are inclined with respect to the center line of the pickax permalloy pattern in the direction of rotation of the drive field.

26. A magnetic bubble memory device according to claim 21, wherein said first U-shaped pattern has a base and two parallel arms, both of the arms of said first U-shaped pattern having an S-shape whereby the base of said first U-shaped pattern is aligned with the center line of the pickax permalloy pattern.

* * * * *